(12) United States Patent
Oh

(10) Patent No.: US 10,878,868 B2
(45) Date of Patent: *Dec. 29, 2020

(54) NONVOLATILE MEMORY DEVICE PERFORMING PROGRAM OPERATION AND OPERATION METHOD THEREOF

(71) Applicant: SK hynix Inc., Gyeonggi-do (KR)

(72) Inventor: Jin Yong Oh, Portland, OR (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/657,659

(22) Filed: Oct. 18, 2019

(65) Prior Publication Data
US 2020/0051605 A1 Feb. 13, 2020

Related U.S. Application Data

(63) Continuation of application No. 16/021,958, filed on Jun. 28, 2018, now Pat. No. 10,490,244.

(60) Provisional application No. 62/526,632, filed on Jun. 29, 2017.

(51) Int. Cl.
G11C 8/08 (2006.01)
H01L 27/1157 (2017.01)
G11C 8/14 (2006.01)
G11C 16/04 (2006.01)
G11C 16/24 (2006.01)
G11C 16/26 (2006.01)
G06F 11/10 (2006.01)
G11C 16/34 (2006.01)
G11C 16/08 (2006.01)
G11C 16/10 (2006.01)
H01L 27/11582 (2017.01)

(52) U.S. Cl.
CPC ............ *G11C 8/08* (2013.01); *G06F 11/1044* (2013.01); *G06F 11/1048* (2013.01); *G11C 8/14* (2013.01); *G11C 16/0483* (2013.01); *G11C 16/08* (2013.01); *G11C 16/10* (2013.01); *G11C 16/24* (2013.01); *G11C 16/26* (2013.01); *G11C 16/3427* (2013.01); *H01L 27/1157* (2013.01); *H01L 27/11582* (2013.01)

(58) Field of Classification Search
CPC ....... G11C 8/08; G11C 16/08; G11C 16/3427; G11C 16/10; G11C 16/0483; G11C 8/14; G11C 16/26; G11C 16/24; G06F 11/1048; G06F 11/1044; H01L 27/1157; H01L 27/11582
USPC .................................................... 365/230.01
See application file for complete search history.

(56) References Cited

U.S. PATENT DOCUMENTS 8,582,357 B2 * 11/2013 Sarin .................. G11C 16/3427
365/185.02
9,373,401 B2 * 6/2016 Joo ..................... G11C 16/3459
9,576,669 B2 * 2/2017 Choo .................. G11C 16/3459
9,792,991 B1 * 10/2017 Toriyama ........... G11C 16/0483
(Continued)

Primary Examiner — Fernando Hidalgo
(74) Attorney, Agent, or Firm — IP & T Group LLP

(57) ABSTRACT

A nonvolatile memory device includes: a plurality of word lines that are stacked; a vertical channel region suitable for forming a cell string along with the word lines; and a voltage supplier suitable for supplying a plurality of biases required for a program operation on the word lines, where a negative bias is applied to neighboring word lines disposed adjacent to a selected word line at an end of a pulsing section of a program voltage which is applied to the selected word line.

19 Claims, 16 Drawing Sheets

(56) References Cited

U.S. PATENT DOCUMENTS

| | | | |
|---|---|---|---|
| 10,157,676 B2* | 12/2018 | Pang | G11C 16/30 |
| 2014/0140137 A1* | 5/2014 | Kondo | G11C 16/3404 |
| | | | 365/185.17 |
| 2015/0221351 A1* | 8/2015 | Park | G11C 16/10 |
| | | | 365/51 |
| 2017/0365349 A1* | 12/2017 | Pang | G11C 16/26 |

* cited by examiner

ND OPERATION METHOD THEREOF

NONVOLATILE MEMORY DEVICE PERFORMING PROGRAM OPERATION AND OPERATION METHOD THEREOF

CROSS-REFERENCE TO RELATED APPLICATIONS

This application is a continuation of U.S. patent application Ser. No. 16/021,958 filed on Jun. 28, 2018, which claims priority to U.S. Provisional Patent Application No. 62/526,632 entitled, "PROGRAMMING METHOD FOR REDUCING CHARGE-TRAPPING BETWEEN ADJACENT WORD LINES", filed on Jun. 29, 2017, which is incorporated herein by reference in its entirety.

BACKGROUND

1. Field

Exemplary embodiments of the present invention relate to a semiconductor design technology, and more particular, to a nonvolatile memory device which performs a program operation.

2. Description of the Related Art

Due to the shift in recent computing environment, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a nonvolatile memory device capable of suppressing the shift in cell threshold voltages (i.e., Z-interference) that is caused by charges trapped in a region between neighboring word lines due to the fringing field generated in a program operation.

In an embodiment, a nonvolatile memory device includes: a plurality of word lines that are stacked; a vertical channel region suitable for forming a cell string along with the word lines; and a voltage supplier suitable for supplying a plurality of biases required for a program operation on the word lines, where a negative bias is applied to neighboring word lines disposed adjacent to a selected word line at an end of a pulsing section of a program voltage which is applied to the selected word line.

In an embodiment, a method for operating a nonvolatile memory device with a plurality of word lines forming a cell string, includes: applying a program voltage to a selected word line and applying a pass voltage to unselected word lines; and applying a negative bias to neighboring word lines disposed adjacent to the selected word line among the unselected word lines while applying the program voltage to the selected word line.

In an embodiment, a nonvolatile memory device includes: a plurality of word lines forming a cell string; and a voltage supplier suitable for supplying a plurality of biases required for a program operation on the word lines, wherein a negative bias is applied to neighboring word lines disposed adjacent to a selected word line at an end of a pulsing section of a program voltage which is applied to the selected word line.

DETAILED DESCRIPTION

Figure 1:
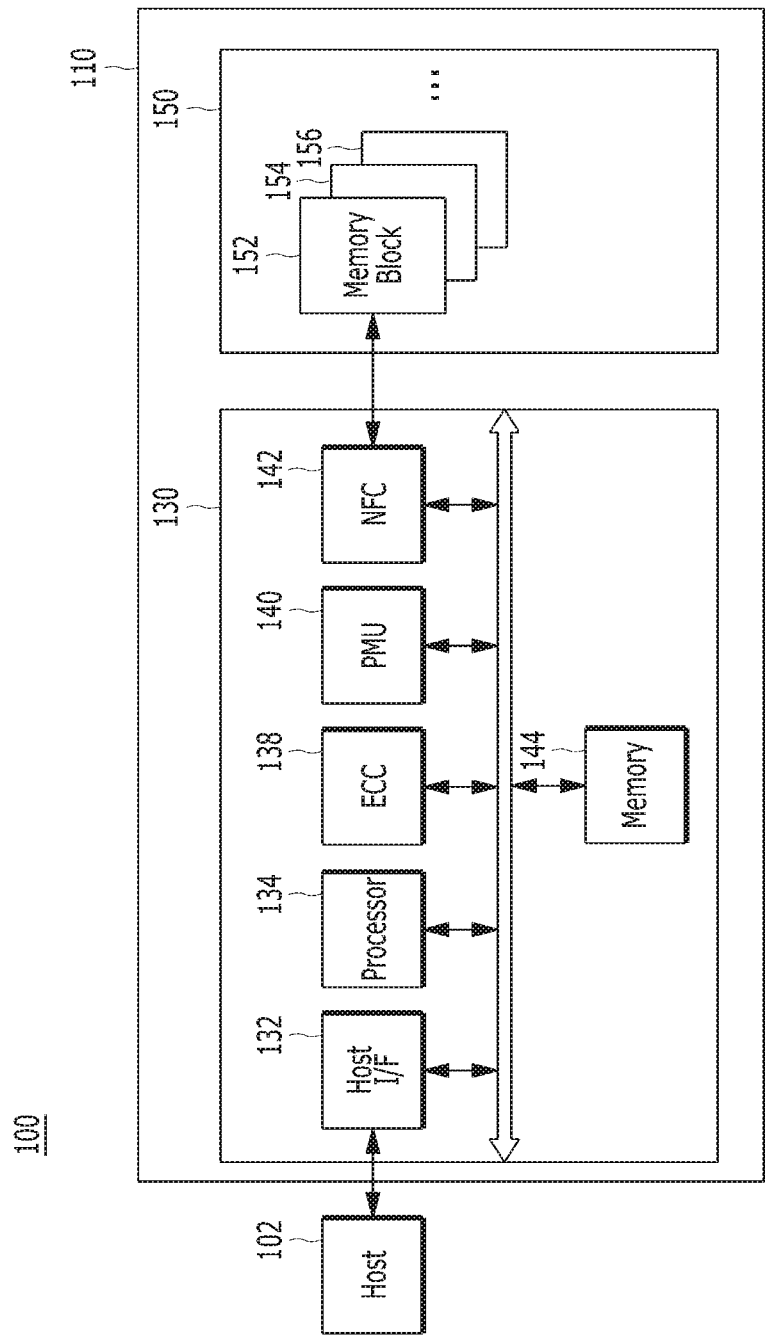
FIG. 1 is a diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a data processing system including a memory system in accordance with an embodiment.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. That is, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when a power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. Therefore, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (DATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host is 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
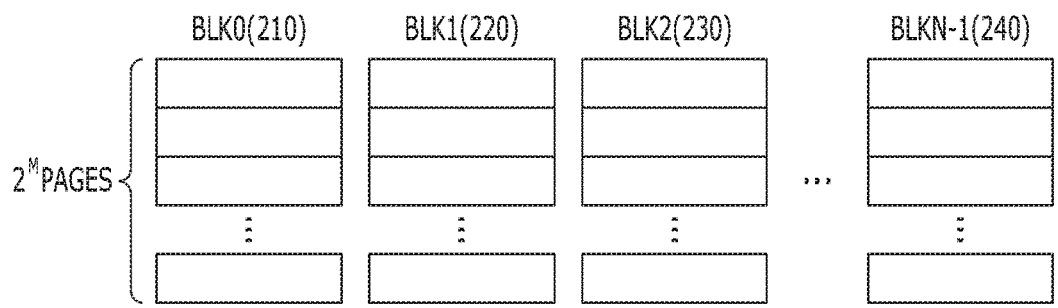
FIG. 2 is a diagram illustrating a memory device in the memory system shown in FIG. 1.

FIG. 2 is a schematic diagram illustrating the memory device 150 shown in FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Additionally, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host 102 during a write operation, and may provide stored data to the host 102 during a read operation.

Figure 3:
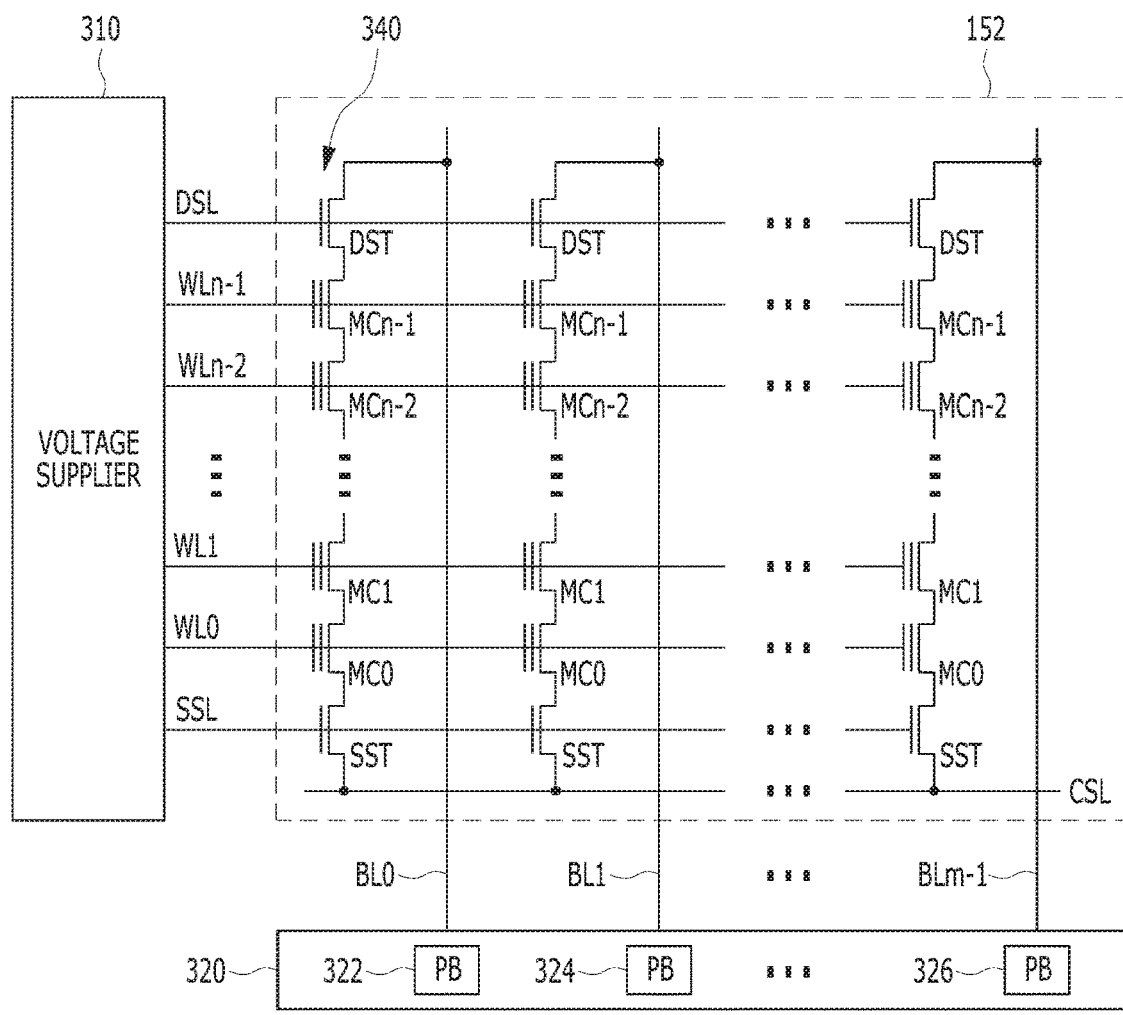
FIG. 3 is a circuit diagram illustrating a memory block in a memory device in accordance with an embodiment.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by multi-level cells (MLC) each of which stores data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage suppler 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage suppler 310 may perform a voltage generating operation under the control of a control circuit (not shown). The voltage suppler 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Additionally, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. The read/write circuit 320 may include a plurality of page buffers 322, 324 and 326 respectively corresponding to columns or bit lines, or pairs of columns or pairs of bit lines, and a plurality of latches (not shown) may be included in each of the page buffers 322, 324 and 326.

FIGS. 4 to 11 are schematic diagrams illustrating the memory device 150 shown in FIG. 1.

Figure 4:
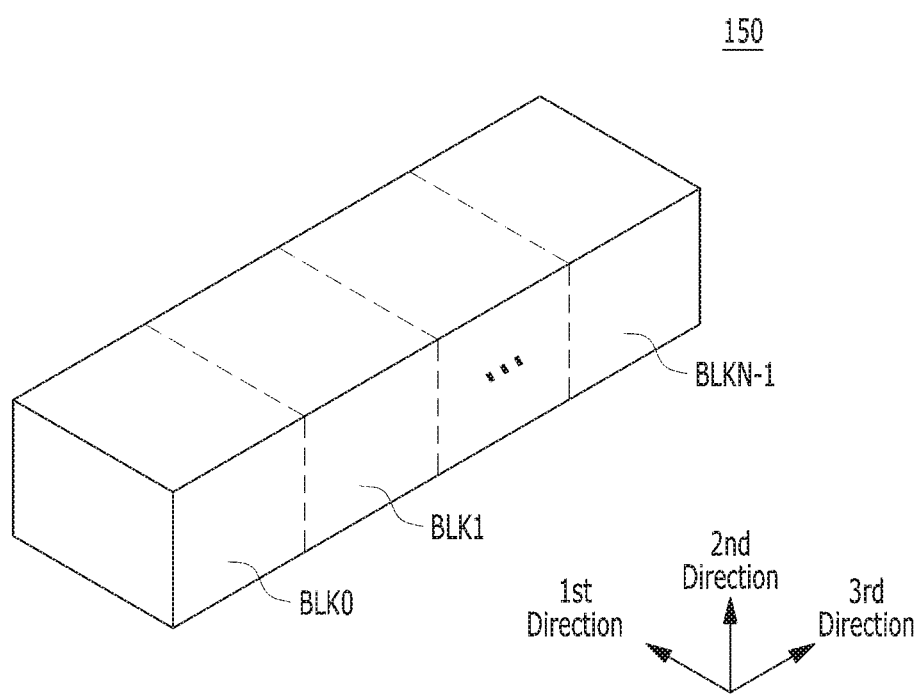
FIGS. 4 to 11 are diagrams schematically illustrating the memory device shown in FIG. 2.

FIG. 4 is a block diagram illustrating an example of the plurality of memory blocks 152 to 156 of the memory device 150 shown in FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions, for example, an x-axis direction, a y-axis direction and a z-axis direction.

The respective memory blocks BLK0 to BLKN-1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. That is, the respective memory blocks BLK0 to BLKN-1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
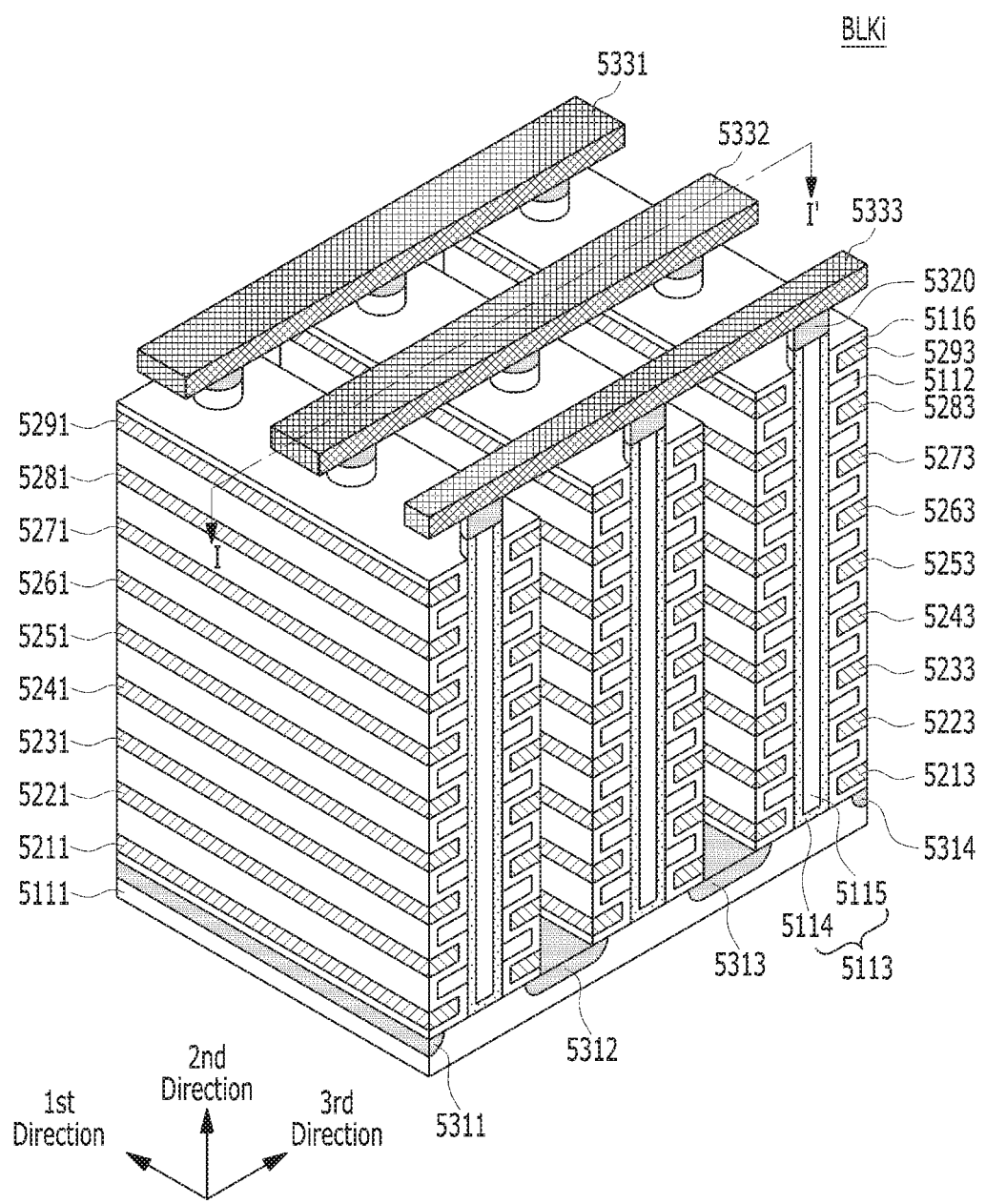
Figure 6:
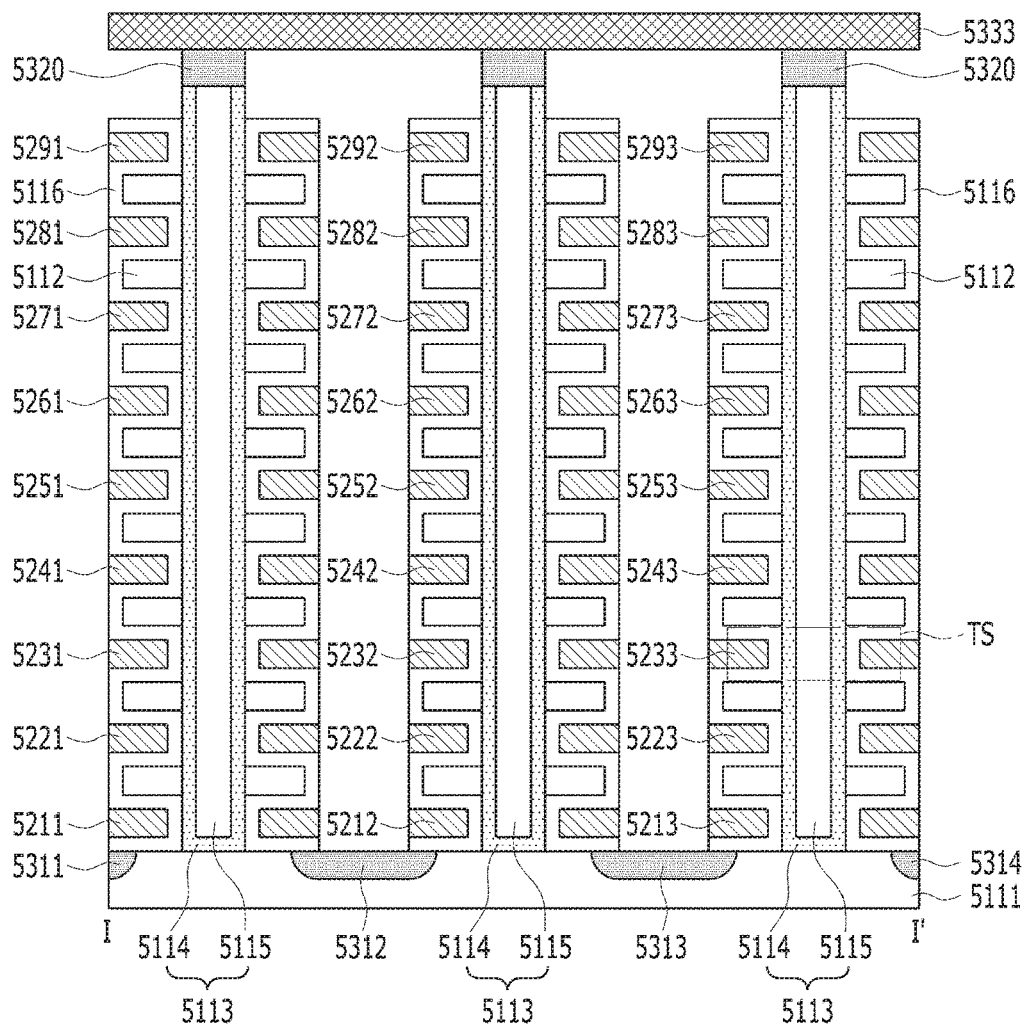

FIG. 5 is a perspective view of one BLKi of the plural memory blocks BLK0 to BLKN-1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. Although in this embodiment the first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. That is, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. Although in this embodiment the drains 5320 include n-type silicon, it is to be noted that the drains 5320 are not limited to being n-type silicon. Furthermore, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
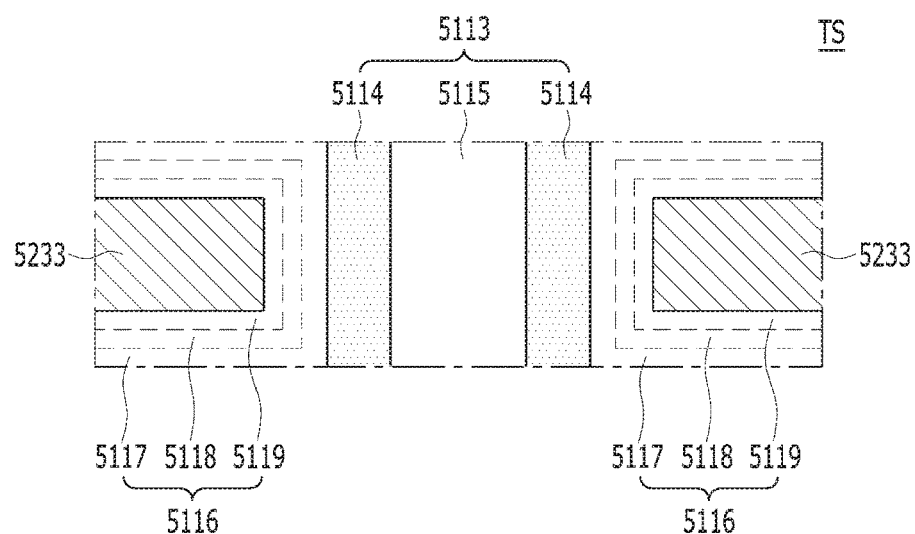

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. That is, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. That is, the gates or the control gates may extend in the first direction and form word lines, at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Furthermore, the memory block BLKi may include a plurality of NAND strings NS which extend in a direction perpendicular to the substrate 5111, such as, the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. That is, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
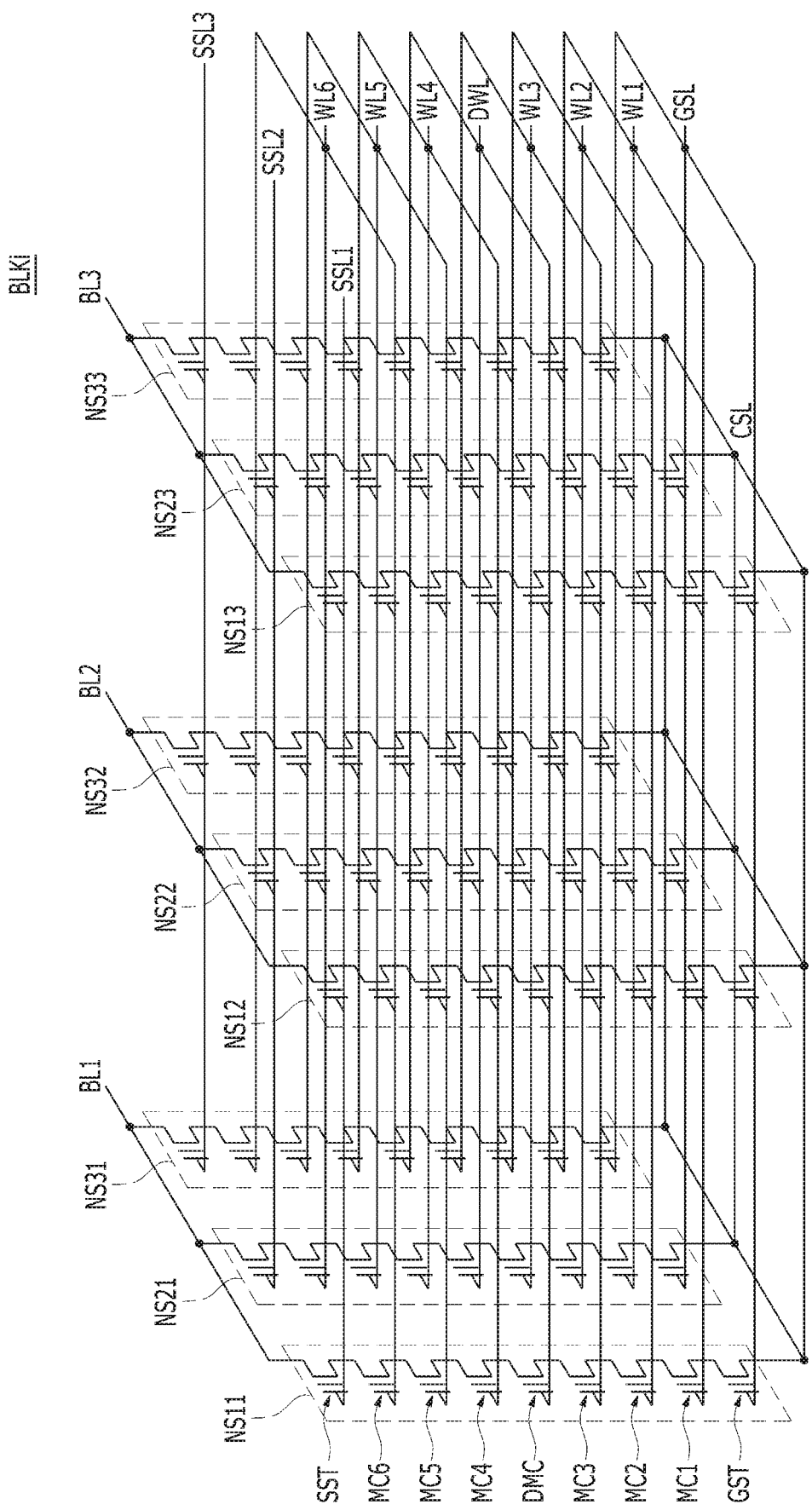

FIG. 8 is an equivalent circuit diagram illustrating the memory block BLK1 having a first structure described with reference to FIGS. 5 to 7.

Referring to FIG. 8, in a block BLK1 having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns, and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. That is, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. The ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

As shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the source select transistor (or string select transistor) SST may be referred to as an upper memory cell group.

Hereinbelow, detailed descriptions will be made with reference to FIGS. 9 to 11, which show the memory device in the memory system in accordance with an embodiment implemented with a three-dimensional (3D) nonvolatile memory device different from the first structure.

Figure 9:
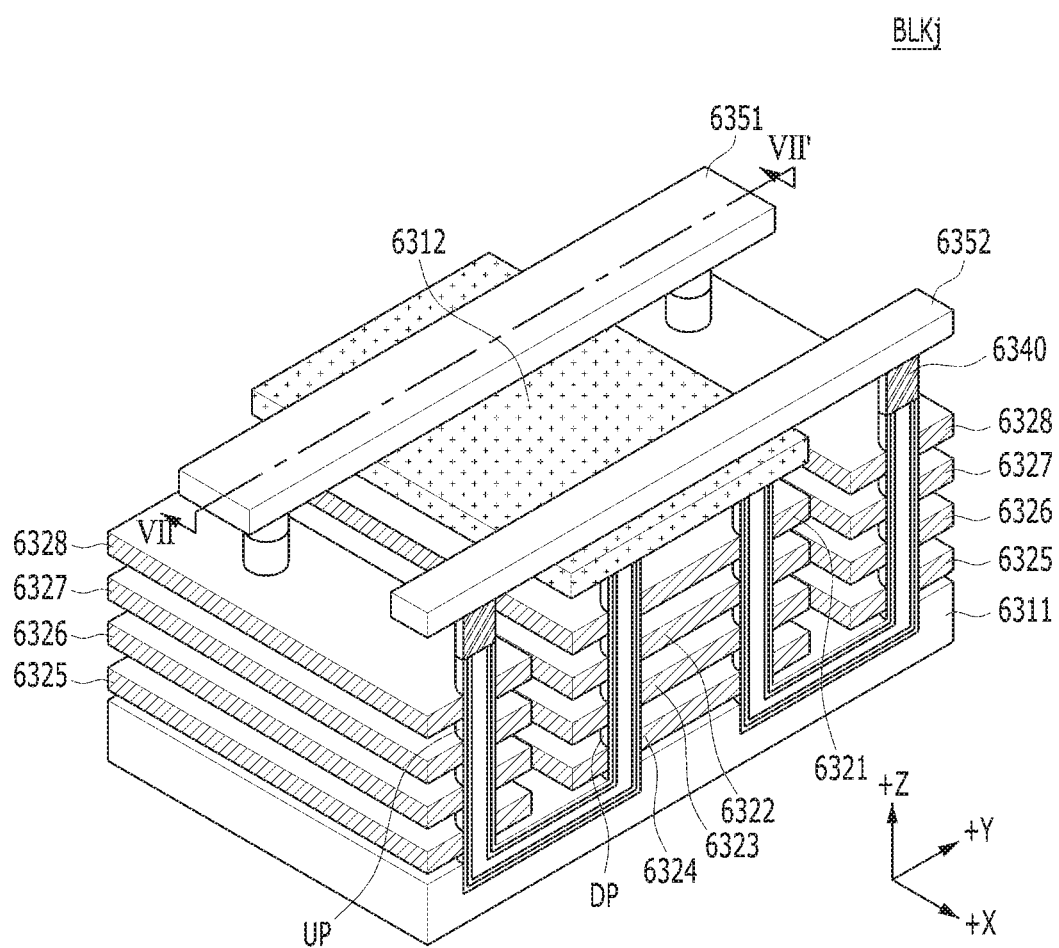

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
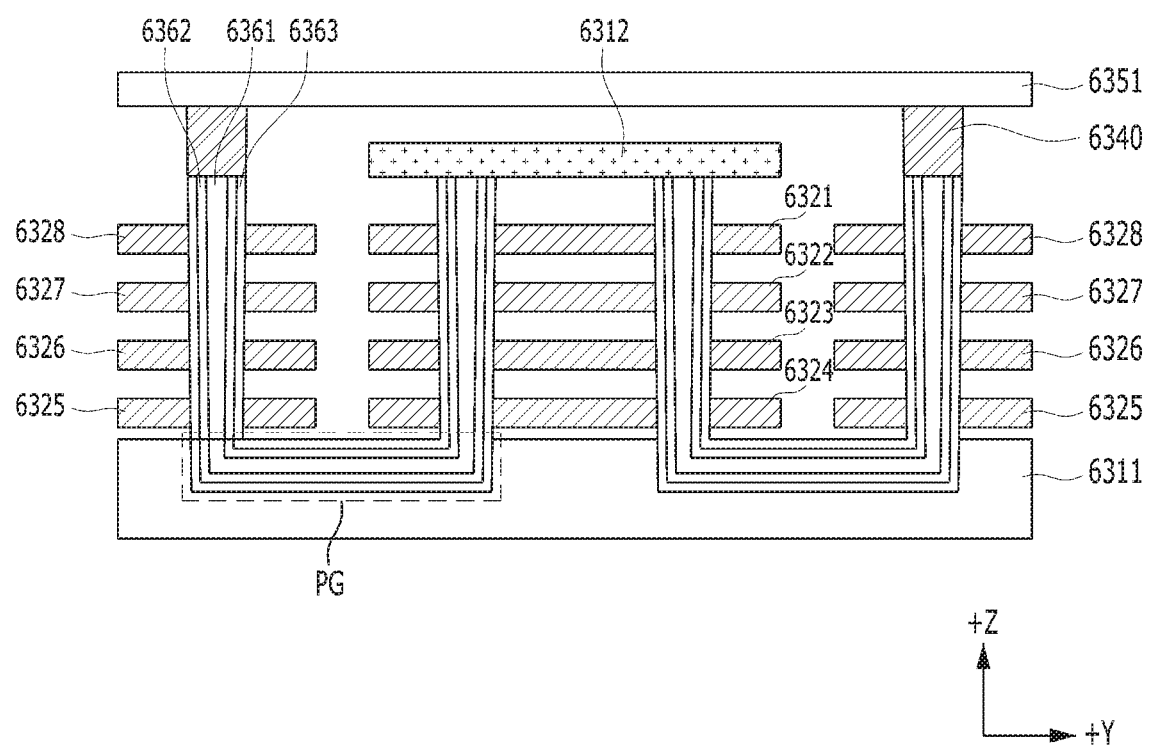

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. Although in this embodiment the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Additionally, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
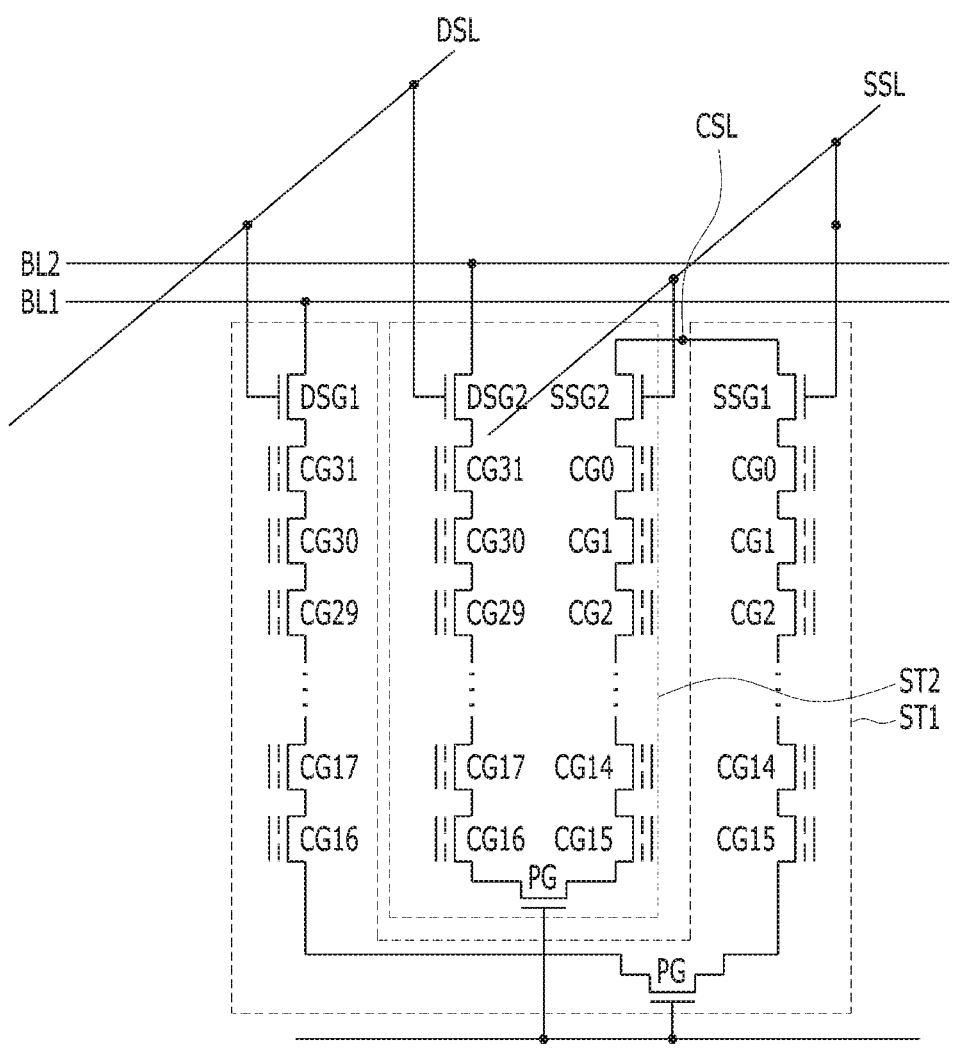

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

That is, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Figure 12:
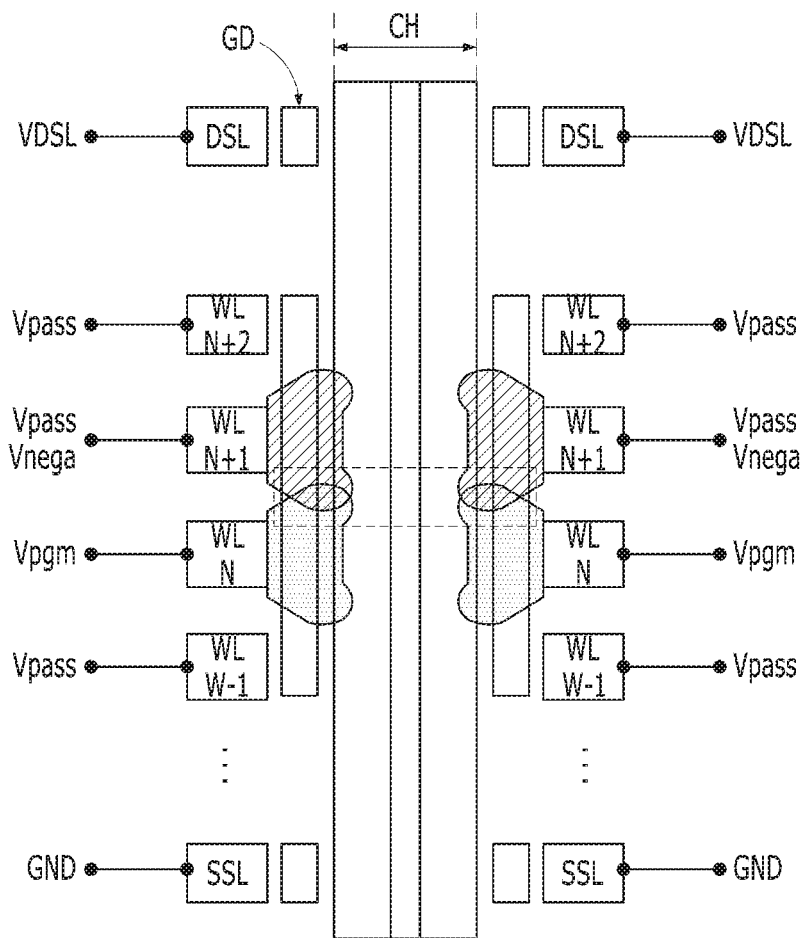
FIG. 12 is a diagram illustrating a line biasing in a program operation of a nonvolatile memory device in accordance with an embodiment of the present invention.

FIG. 12 illustrates a line biasing in a program operation of a nonvolatile memory device in accordance with an embodiment of the present invention, and shows a vertical cross-section of a pillar structure that forms transistors in a 3D NAND cell string. Herein, although a 3D NAND flash memory having a vertical channel region as illustrated in FIGS. 5 and 6 is described as an example, the concept and spirit of the present invention are not limited thereto.

Referring to FIG. 12, the 3D NAND cell string of the nonvolatile memory device in accordance with the embodiment of the present invention may include a plurality of word lines WLs that are stacked between a source selection line SSL and a drain selection line DSL, and a vertical channel region CH penetrating through the word lines in the vertical direction. Herein, a gate dielectric structure GD may be interposed between the vertical channel region CH and the stacked lines, and the gate dielectric structure GD may include a blocking dielectric layer/a charge trapping layer/a tunneling dielectric layer that are sequentially stacked in a direction from the word line WLs toward the vertical channel region CH.

Generally, when a 3D NAND cell string is selected and a program operation is performed, the program operation may be performed sequentially from a word line disposed close to the source selection line SSL to a word line disposed close to the drain selection line DSL. Of course, not all the word lines of the selected cell string may be programmed. When a 3D NAND cell string is selected, the source selection line SSL may be biased with the ground voltage GND and the drain selection line DSL may be biased with the drain selection voltage VDSL.

During the program operation, a program voltage Vpgm may be applied to a program target word line (e.g., Nth WL) and a pass voltage Vpass may be applied to the remaining word lines. Herein, charges entering from the vertical channel region CH may be trapped in the gate dielectric structure GD overlapping with the word line (i.e., the Nth WL) in which the program operation is being performed, and the trapped charges may increase the threshold voltage of the corresponding cell. This may be said that the cell is programmed. However, a strong electric field caused by the program voltage Vpgm may cause a fringing field, and this fringing field may unintentionally lead charge trapping into a region between the word line Nth WL being programmed and a neighboring word line N+1th WL. Meanwhile, the charges trapped in the region between the two word lines (Nth WL and N+1th WL) (where the region is indicated by a dotted line in the figure) may affect the program operation on the subsequent word line (N+1th WL) and cause an unintentional shift of a cell threshold voltage, which generally appears in a form in which the cell threshold voltage distribution is broadened. This interference phenomenon is commonly called Z-interference and it is one of the most critical interference models in the 3D NAND flash memory.

According to the embodiment of the present invention, while a program operation is performed onto the word line Nth WL, that is, in a section where the program voltage Vpgm is applied to the neighboring word line N+1th WL, a negative bias Vnega is additionally applied to the pass voltage Vpass. This negative bias Vnega may be applied to the end of a pulsing section of the program voltage Vpgm, and the program target word line Nth WL may be discharged until all the word lines are precharged during a section in which the negative bias Vnega is applied. Herein, the bias for each line in the above-mentioned program operation may be provided by the voltage supplier 310 shown in FIG. 3. The electric field caused by the negative bias Vnega may compensate for the positive fringing field based on the program voltage Vpgm, and the charges trapped in the region between the two neighboring word lines Nth WL and N+1th WL (indicated by a dotted line in the figure) may be discharged or suppressed from being trapped in the region.

Figure 13A:
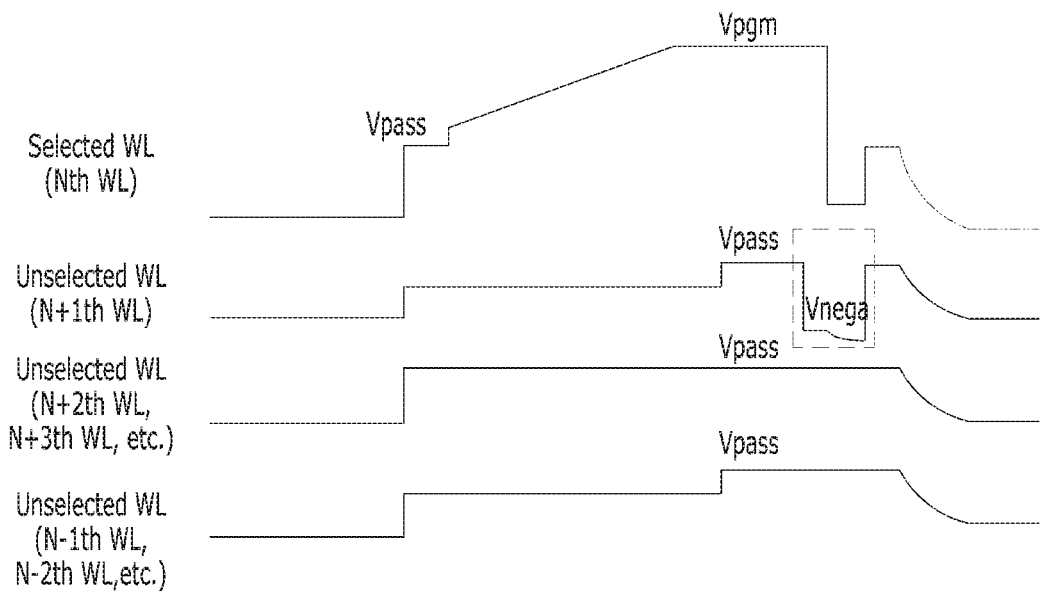
FIG. 13A is a diagram illustrating a biasing waveform in the program operation shown in FIG. 12.
Figure 13B:
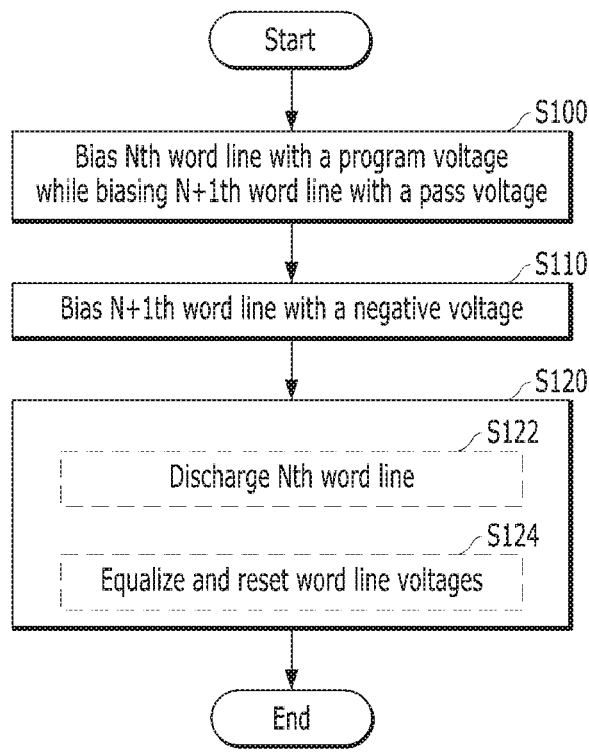
FIG. 13B is a flowchart illustrating a program operation of a nonvolatile memory device in accordance with an embodiment of the present invention.

FIG. 13A is a diagram illustrating a biasing waveform in the program operation shown in FIG. 12, and FIG. 13B is a flowchart illustrating a program operation of a nonvolatile memory device in accordance with an embodiment of the present invention.

When there is a write request from the outside of the nonvolatile memory device (e.g., a host), the memory controller may perform an erase operation on the basis of a memory block and then perform a program operation on the basis of a page (e.g., a word line). From the perspective of a cell string, a program operation may be performed sequentially from the word line close to the source selection line SSL toward the word lines toward the drain selection line DSL based on the data inputted with the command. FIGS. 13A and 13B illustrate a case where the Nth word line Nth WL among the word lines included in the cell string is selected.

First of all, the program voltage Vpgm may be applied to the selected word line Nth WL, and at the same time, the pass voltage Vpass may be applied to the remaining unselected word lines at step S100. Herein, each word line may be precharged with, for example, the ground voltage GND level before each word line is biased with the program voltage Vpgm or the pass voltage Vpass. Also, in applying the program voltage Vpgm and the pass voltage Vpass, a multi-step rising method may be used. In the case of the program voltage Vpgm, first, the pass voltage level may be applied, and then the voltage level is gradually raised to a predetermined program voltage level, and the level is maintained for a predetermined time. In the case of the word lines N−1th WL and N+1th WL adjacent to the word line Nth WL in which the program operation is being performed among the unselected word lines, a preliminary pass voltage level having a lower level than the predetermined pass voltage level may be applied, and the predetermined pass voltage level may be applied within a section where the selected word line Nth WL maintains a predetermined program voltage level. By using the multi-step rising method, it is possible to reduce the word line biasing level difference caused by the difference in the loading value of the word lines WLs from the voltage supplier 310. Meanwhile, for the unselected word lines N−2th WL, N+2th WL, etc., other than the word lines N−1th WL and N+1th WL that are disposed adjacent to the word line Nth WL where the program operation is being performed, the predetermined pass voltage level may be directly applied without using the multi-step rising method.

Subsequently, a negative bias Vnega may be applied to the word lines disposed adjacent to the word line Nth WL in which the program operation is being performed at the end of the pulsing section of the program voltage Vpgm where the selected word line Nth WL maintains the predetermined program voltage level at step S110. According to an embodiment of the present invention, among the word lines N−1th WL and N+1th WL disposed adjacent to the word line Nth WL where the program operation is performed, the negative bias Vnega may be applied only to the neighboring word line N+1th WL which is to be programmed subsequently in the order of the program operation. In the case of the word line N−1th WL, the application of the negative bias Vnega may change the state of the previous program. Meanwhile, the negative bias Vnega may have a level lower than the ground voltage GND, and the lower the level is, the stronger the compensation electric field may be formed. Also, the longer the section where the negative bias Vnega is applied becomes, the more advantageous it is. In this case, however, the entire program time may excessively increase. Therefore, the length of the section may have to be determined at an appropriate length.

Subsequently, each of the word lines WLs may be precharged at step S120. In the case of the precharge operation, a method of simultaneously stopping the supply of the bias applied to the word lines WLs may be used. Besides, various other precharge methods may be applied. FIG. 13A illustrates a case where a method of discharging the word line Nth WL biased with the program voltage Vpgm to the ground voltage GND level is applied.

First of all, the word line may be discharged to the ground voltage GND level in the section where the selected word line Nth WL maintains the predetermined program voltage level at step S122. Herein, the negative bias Vnega may be applied to the neighboring word line N+11th WL, and the level of the negative bias Vnega may be decreased by the coupling of the two word lines Nth WL and N+1th WL. This word line discharge operation may prevent re-distribution of charges normally trapped in the gate dielectric structure GD overlapping with the selected word line Nth WL.

Subsequently, the voltages applied to the respective word lines WLs may be equalized to the same level, for example, the level of the predetermined pass voltage Vpass, and then the respective word line voltages may be reset at step S124. When the word line voltages are reset, the word lines may be lowered to the precharge level, e.g, the ground voltage GND level.

As described above, in the embodiment of the present invention, the negative bias Vnega may be applied to the neighboring word line N+1th WL at the end of the pulsing section of the program voltage Vpga with respect to the selected word line Nth WL. The electric field caused by the negative bias Vnega may compensate the positive fringing field based on the program voltage Vpgm to discharge the charges that are trapped in the region between the two neighboring word lines Nth WL and N+1th WL or suppress the charges from being trapped in the region. In other words, Z-interference may be mitigated, which means that the cell threshold voltage distribution may be kept narrow.

Although it is illustrated in this embodiment that the program voltage Vpgm is pulsed once as shown in FIG. 13A, the technology of the present invention may be applied to a case where an Incremental Step Pulse Program (ISPP) method is used during a program operation as well. In other words, a program loop may be repeated while increasing the program voltage Vpgm by the step voltage ΔV until the memory cells coupled to the word line are programmed to a desired level. In this case, the negative bias Vnega may be applied at a constant level regardless of the level rise of each pulse of each program voltage Vpgm. It is also possible to use a method of lowering the level of the negative bias Vnega by a predetermined level whenever the level of each pulse of the program voltage Vpgm is increased.

Although, in this embodiment, a 3D NAND flash memory having a vertical channel region is described as an example, the concept and spirit of the present may be adapted to a nonvolatile memory device (e.g., bulk type NAND flash memory), which has a plurality of word lines forming a cell string and sequentially programs the word lines.

FIGS. 14 to 22 are diagrams schematically illustrating exemplary applications of the data processing system of FIG. 1.

Figure 14:
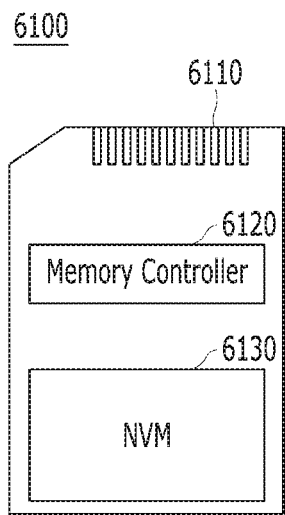
FIGS. 14 to 22 are diagrams schematically illustrating exemplary applications of the data processing system shown in FIG. 1 in accordance with various embodiments of the present invention.

FIG. 14 is a diagram schematically illustrating an example of the data processing system including the memory system in accordance with the present embodiment. In this case, FIG. 14 schematically illustrates a memory card system to which the memory system in accordance with the present embodiment is applied.

Referring to FIG. 14, the memory card system 6100 may include a memory controller 6120, a memory device 6130, and a connector 6110.

More specifically, the memory controller 6120 may be connected to the memory device 6130 embodied by a nonvolatile memory, and may access the memory device 6130. For example, the memory controller 6120 may control read, write, erase, and background operations of the memory device 6130. The memory controller 6120 may o provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processing unit, a host interface, a memory interface, and an error correction unit.

The memory controller 6120 may communicate with an external device, for example, the host 102 of FIG. 1 through the connector 6110. For example, as described with reference to FIG. 1, the memory controller 6120 may communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI, and Bluetooth. Thus, the memory system and the data processing system in accordance with the present embodiment may be applied to wired/wireless electronic devices or mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC), and a universal flash storage (UFS).

Figure 15:
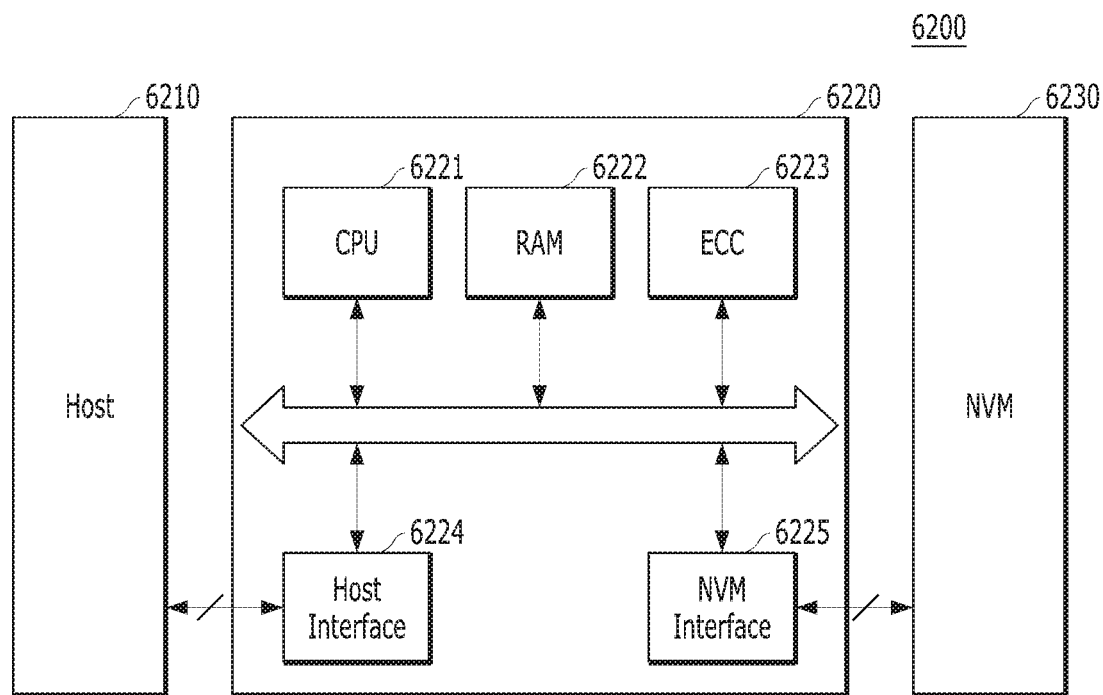

FIG. 15 is a diagram schematically illustrating another example of the data processing system including the memory system in accordance with the present embodiment.

Referring to FIG. 15, the data processing system 6200 may include a memory device 6230 having one or more nonvolatile memories and a memory controller 6220 for controlling the memory device 6230. The data processing system 6200 illustrated in FIG. 15 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224, and a memory interface such as an NVM interface 6225.

The CPU 6221 may control overall operations on the memory device 6230 such as read, write, file system management, and bad page management operations. The RAM 6222 may be operated according to control of the CPU 6221, and used as a work memory, buffer memory, or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC, or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe, or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 may communicate with the external device through one or more of various communication protocols, the memory system and the data processing system in accordance with the present embodiment may be applied to wired/wireless electronic devices or particularly a mobile electronic device.

Figure 16:
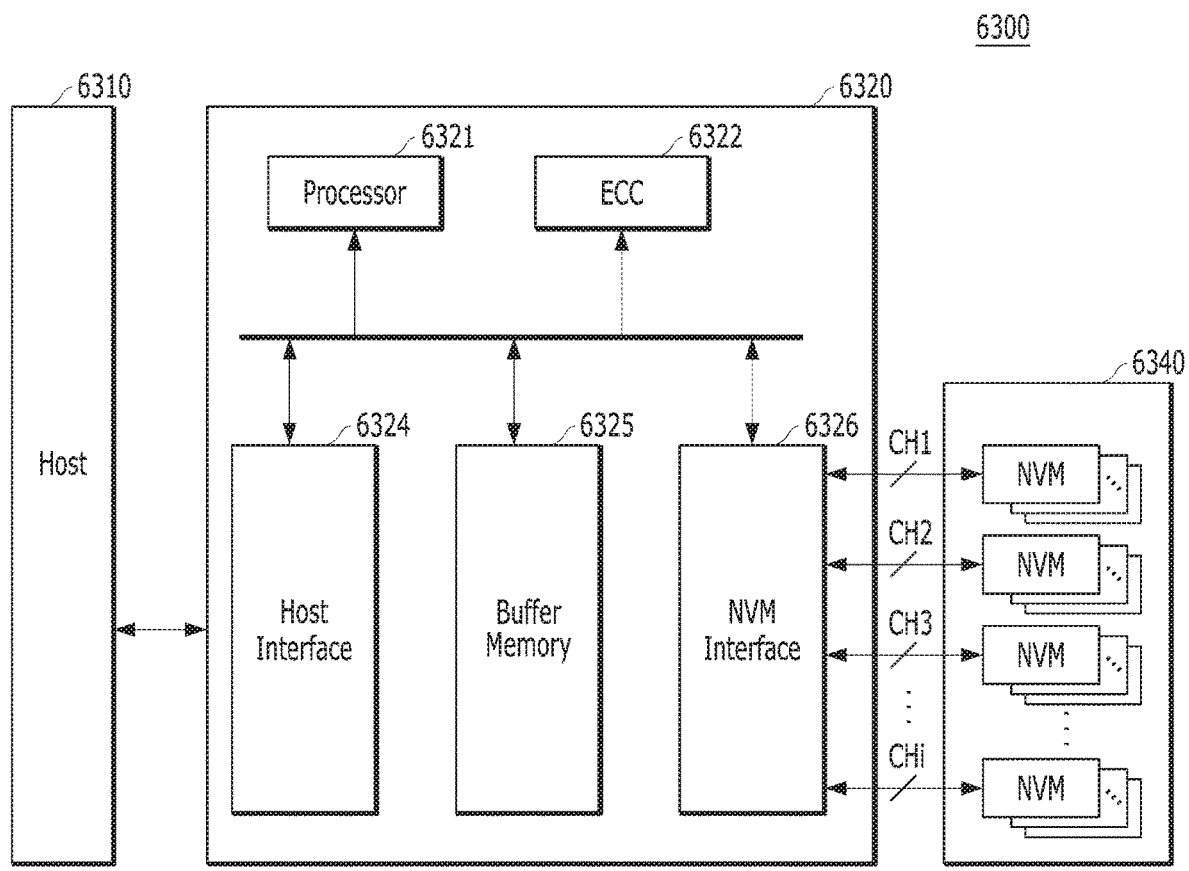

FIG. 16 is a diagram schematically illustrating another example of the data processing system including the memory system in accordance with an embodiment of the present invention. FIG. 16 schematically illustrates an SSD to which the memory system in accordance with the present embodiment is applied.

Referring to FIG. 16, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324, and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM, and GRAM or nonvolatile memories such as FRAM, ReRAM, STT-MRAM, and PRAM. For convenience of description, FIG. 15 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, Redundant Array of Independent Disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read operation in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 17:
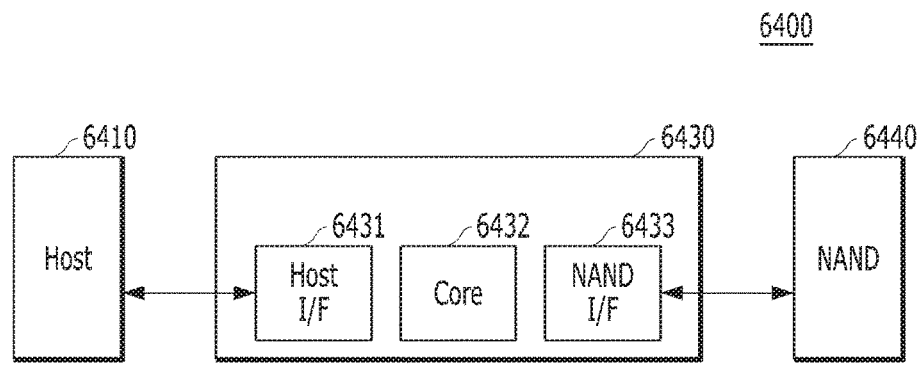

FIG. 17 is a diagram schematically illustrating another example of the data processing system including the memory system in accordance an embodiment of the present invention. FIG. 17 schematically illustrates an embedded Multi-Media Card (eMMC) to which the memory system in accordance with the present embodiment is applied.

Referring to FIG. 17, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS-I/UHS-II) interface.

FIGS. 18 to 21 are diagrams schematically illustrating other examples of the data processing system including the memory system in accordance with an embodiment of the present invention. FIGS. 18 to 21 schematically illustrate Universal Flash Storage (UFS) systems to which the memory system in accordance with the present embodiment is applied.

Referring to FIGS. 18 to 21, the UFS systems 6500, 6600, 6700, and 6800 may include hosts 6510, 6610, 6710, and 6810, UFS devices 6520, 6620, 6720, and 6820, and UFS cards 6530, 6630, 6730, and 6830, respectively. The hosts 6510, 6610, 6710, and 6810 may serve as application processors of wired/wireless electronic devices or particularly mobile electronic devices, the UFS devices 6520, 6620, 6720, and 6820 may serve as embedded UFS devices, and the UFS cards 6530, 6630, 6730, and 6830 may serve as external embedded UFS devices or removable UFS cards.

The hosts 6510, 6610, 6710, and 6810, the UFS devices 6520, 6620, 6720, and 6820, and the UFS cards 6530, 6630, 6730, and 6830 in the respective UFS systems 6500, 6600, 6700, and 6800 may communicate with external devices, for example, wired/wireless electronic devices or mobile electronic devices through UFS protocols, and the UFS devices 6520, 6620, 6720, and 6820 and the UFS cards 6530, 6630, 6730, and 6830 may be embodied by the memory system 110 illustrated in FIG. 1. For example, in the UFS systems 6500, 6600, 6700, and 6800, the UFS devices 6520, 6620, 6720, and 6820 may be embodied in the form of the data processing system 6200, the SSD 6300 or the eMMC 6400 described with reference to FIGS. 15 to 17, and the UFS cards 6530, 6630, 6730, and 6830 may be embodied in the form of the memory card system 6100 described with reference to FIG. 14.

Furthermore, in the UFS systems 6500, 6600, 6700, and 6800, the hosts 6510, 6610, 6710, and 6810, the UFS devices 6520, 6620, 6720, and 6820, and the UFS cards 6530, 6630, 6730, and 6830 may communicate with each other through an UFS interface, for example, Unified Protocol (MIPI M-PHY and MIPI UniPro) in Mobile Industry Processor Interface (MIPI). Furthermore, the UFS devices 6520, 6620, 6720, and 6820 and the UFS cards 6530, 6630, 6730, and 6830 may communicate with each other through various protocols other than the UFS protocol, for example, UFDs, MMC, SD, mini-SD, and micro-SD.

Figure 18:
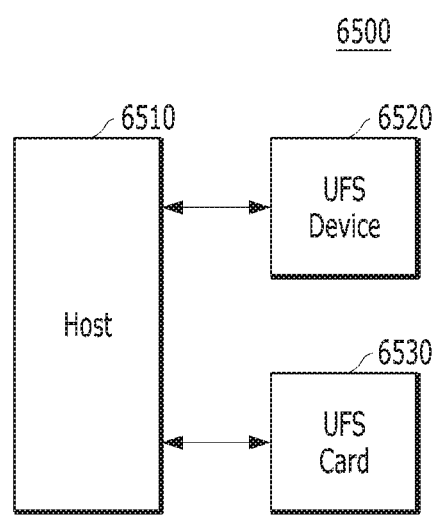

In the UFS system 6500 illustrated in FIG. 18, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 19:
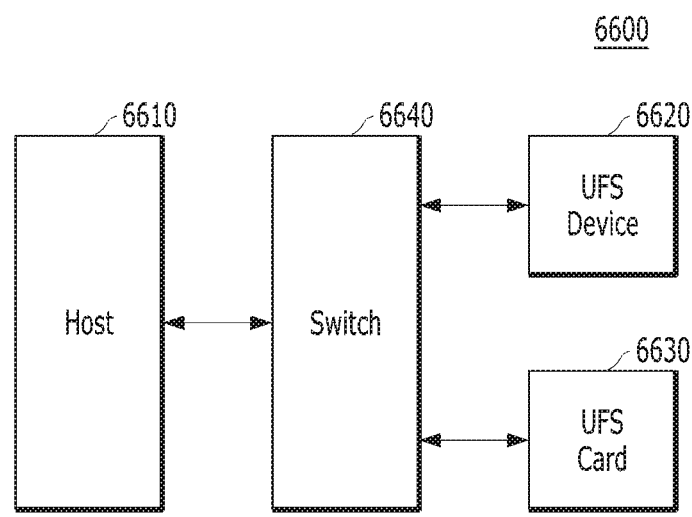

In the UFS system 6600 illustrated in FIG. 19, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 20:
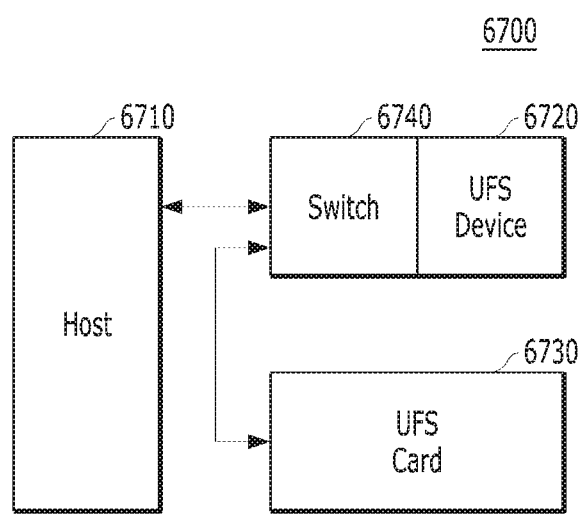

In the UFS system 6700 illustrated in FIG. 20, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 21:
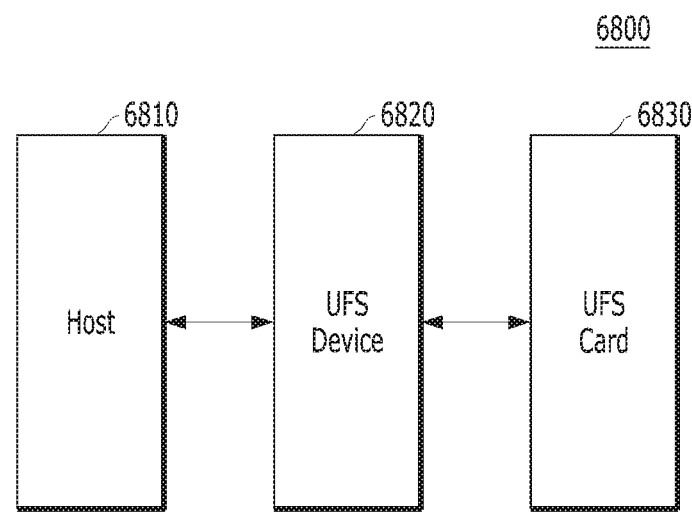

In the UFS system 6800 illustrated in FIG. 21, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 22:
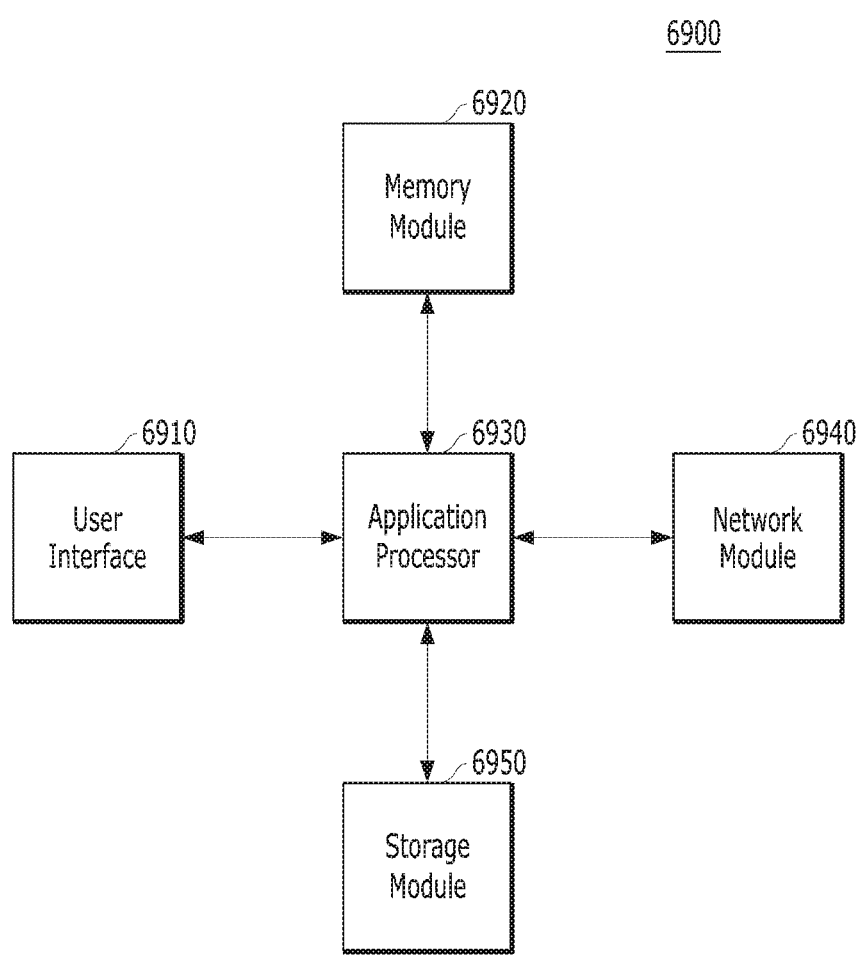

FIG. 22 is a diagram schematically illustrating another example of the data processing system including the memory system in accordance with an embodiment of the present invention. FIG. 22 is a diagram schematically illustrating a user system to which the memory system in accordance with the present embodiment is applied.

Referring to FIG. 22, the user system 6900 may include an application processor 6930, a memory module 6920, a network module 6940, a storage module 6950, and a user interface 6910.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory, or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM, or LPDDR3 SDRAM, or a nonvolatile RAM such as PRAM, ReRAM, MRAM, or FRAM. For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash, and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 16 to 21.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor, and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations to the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

Although various embodiments have been described for illustrative purposes, it will be apparent to those skilled in the art that various changes and modifications may be made without departing from the spirit and scope of the invention as defined in the following claims.

What is claimed is:
1. A nonvolatile memory device, comprising:
a plurality of word lines that are stacked;
a vertical channel region suitable for forming a cell string along with the word lines; and a voltage supplier suitable for supplying a plurality of biases required for a program operation on the word lines, wherein a program voltage is applied to a selected word line, and at a same time a negative bias is applied to neighboring word lines disposed adjacent to the selected word line during an end of a pulsing section of the program voltage which is being applied to the selected word line.

2. The nonvolatile memory device of claim 1, wherein the negative bias is applied to a word line which is to be programmed subsequent to the selected word line among the neighboring word lines disposed adjacent to the selected word line.

3. The nonvolatile memory device of claim 1, wherein the negative bias is applied to a word line among the neighboring word lines disposed adjacent to the selected word line.

4. The nonvolatile memory device of claim 2, wherein all unselected word lines in the cell string are biased with a pass voltage, before the negative bias is applied to the word line which is to be programmed subsequent to the selected word line.

5. The nonvolatile memory device of claim 2, wherein the selected word line is discharged after the negative bias is applied.

6. The nonvolatile memory device of claim 5, wherein the selected word line is discharged with a ground voltage level.

7. The nonvolatile memory device of claim 4, wherein all the word lines in the cell string including the selected word line which is discharged and the neighboring word lines to which the negative bias is applied are equalized with the pass voltage, and all word line voltages are reset.

8. The nonvolatile memory device of claim 1, wherein the program voltage applied to the selected word line is applied in a multi-step rising method.

9. The nonvolatile memory device of claim 8, wherein the pass voltage applied to the neighboring word lines disposed adjacent to the selected word line is applied in the multi-step rising method.

10. A method for operating a nonvolatile memory device with a plurality of word lines forming a cell string, comprising:

applying a program voltage to a selected word line and applying a pass voltage to unselected word lines; and applying, at a same time, a negative bias to neighboring word lines disposed adjacent to the selected word line, among the unselected word lines, during an end of a pulsing section of the program voltage which is being applied to the selected word line.

11. The method of claim 10, wherein the negative bias is applied to a word line which is to be programmed subsequent to the selected word line among the neighboring word lines disposed adjacent to the selected word line.

12. The method of claim 10, wherein the negative bias is applied to a word line among the neighboring word lines disposed adjacent to the selected word line.

13. The method of claim 11, further comprising:
precharging the word lines which is to be programmed subsequent to the selected word line that is included in the cell string after the applying of the negative bias.

14. The method of claim 11, further comprising:
discharging the selected word line after the applying of the negative bias.

15. The method of claim 10, wherein the program voltage applied to the selected word line is applied in a multi-step rising method.

16. The method of claim 15, wherein in the applying of the pass voltage to the unselected word lines,
the pass voltage applied to the neighboring word lines disposed adjacent to the selected word line among the unselected word lines is applied in the multi-step rising method.

17. A nonvolatile memory device, comprising:
a plurality of word lines forming a cell string; and
a voltage supplier suitable for supplying a plurality of biases required for a program operation on the word lines, wherein a program voltage is applied to a selected word line, and at a same time a negative bias is applied to neighboring word lines disposed adjacent to the selected word line during an end of a pulsing section of the program voltage which is being applied to the selected word line.

18. The nonvolatile memory device of claim 17, wherein the negative bias is applied to a word line which is to be programmed subsequent to the selected word line among the neighboring word lines disposed adjacent to the selected word line.

19. The nonvolatile memory device of claim 18, wherein all unselected word lines in the cell string are biased with a pass voltage, before the negative bias is applied to the word line which is to be programmed subsequent to the selected word line.

* * * * *